United States Patent
Tolhuizen et al.

Patent Number: 5,910,961
Date of Patent: Jun. 8, 1999

[54] METHOD AND APPARATUS FOR TRACKWISE BURST ERROR CORRECTION IN A MULTITRACK STORAGE FORMAT

[75] Inventors: Ludovicus M.G.M. Tolhuizen; Constant P.M.J. Baggen, both of Eindhoven, Netherlands

[73] Assignee: U.S. Philips Corporation, New York, N.Y.

[21] Appl. No.: 08/873,375

[22] Filed: Jun. 12, 1997

[30] Foreign Application Priority Data

Jun. 13, 1996 [EP] European Pat. Off. .............. 96201646

[51] Int. Cl.$^6$ .................................................. H03M 13/00
[52] U.S. Cl. .......................... 371/39.1; 371/40.14; 371/45
[58] Field of Search .................... 371/377, 378, 371/38.1, 39.1, 40.11–40.14, 40.15, 40.16, 40.17, 40.18, 40.3, 40.4, 44, 45; 360/53

[56] References Cited

U.S. PATENT DOCUMENTS

| | | |
|---|---|---|
| 4,201,976 | 5/1980 | Patel ........................................ 371/50.1 |
| 4,205,324 | 5/1980 | Patel ........................................ 371/50.1 |
| 4,395,768 | 7/1983 | Goethals et al. .......................... 371/45 |
| 4,486,882 | 12/1984 | Piret et al. ................................. 371/45 |
| 4,648,091 | 3/1987 | Gajjar .................................... 371/37.09 |
| 4,870,645 | 9/1989 | Herron .................................... 371/37.4 |
| 5,136,592 | 8/1992 | Weng ...................................... 371/39.1 |
| 5,255,272 | 10/1993 | Gill et al. ................................ 371/40.3 |
| 5,487,077 | 1/1996 | Hassner et al. ......................... 371/40.1 |

*Primary Examiner*—Emmanuel L. Moise
*Attorney, Agent, or Firm*—Michael E. Belk

[57] ABSTRACT

A method and apparatus for trackwise burst error correction in multitrack storage has an error protective code format that is based on first and second linear block codes each with a plurality of symbols. Of each word pair that consists of one word from either code, and whose words have a pivot symbol in common, the latter words have mutually different cross-track orientations. Each individual symbol forms the pivot symbol of one such word pair. The method first decodes an error-decodable word pair having such pivot symbol in common. The next word pair is minimally shifted with respect to the latter pivot symbol and is then decoded, such shifting being non-uniform as based on the outcome of a most recent decoding. The method then alternates the shifting and decoding steps.

9 Claims, 5 Drawing Sheets

METHOD AND APPARATUS FOR TRACKWISE BURST ERROR CORRECTION IN A MULTITRACK STORAGE FORMAT

BACKGROUND OF THE INVENTION

The invention relates to a method for trackwise burst error correction, in multitrack storage, based on an error protective code format that comprises first and second linear block codes. Each block code is based on a plurality of symbols, and each individual symbol forms a pivot symbol of a word pair. The word pair consists of one word from either code that have the pivot symbol in common, and have mutually different cross-track orientations.

Error correcting schemes based on so-called Diamond codes, that with respect to the present invention have a somewhat restricted scope, were disclosed in U.S. application Ser. No. 08/304,000 (PHN14909), now abandoned, and U.S. application Ser. No. 08/535,155 (PHN15107), all to the assignee of the present application. Likewise, single- and multitrack error correction schemes based on exclusively convolutional codes have been described in U.S. Pat. Nos. 4,395,768 and 4,486,882 (PHQ81009), respectively, to the present assignee. The previus citations are all hereby incorporated in whole by reference. A diamond code format can be expressed in that first words are disposed across a plurality of tracks running along a tape, whereas second words are disposed across the same plurality of tracks, but at another cross-tape orientation. In this format, user symbols as well as parity symbols are protected by the redundancy of one word from either code. The codes are cyclic or semi-cyclic codes based on multi-bit symbols, in particular (shortened)-Reed-Solomon codes. An advantage of the Diamond format is that the overall code is a finite impulse response code that can be completely self-contained within a finite physical block, yet without adhering to the strict requirements for a block code. The scope of the present invention can be broadened in relation to the Diamond codes, in that other linear block codes can be used for the two separate codes. The multi-bit-symbol restriction as well as the final impulse response are not prerequisites. For brevity, the term Diamond code will be used sometimes hereinafter.

Now, the diamond format encoding does not explicitly address a fault model based on trackwise burst errors; when the format is used in a storage tape organization, whether in magnetic, optical, or other, such trackwise burst could be caused by scratches associated to the tape that moves along the pick-up head and various other media mechanical guidance elements. Another potential fault cause is the breakdown of one or more heads, either at the writing or at the reading operation. There is a need for a strategy that would provide an improved protection, given the existing code format.

SUMMARY OF THE INVENTION

Accordingly, it is an object of the present invention to provide a strategy for optimal decoding of diamond and similar error protection codes that would be able to approach its theoretical maximum amount of error protection in the case of static or dynamic trackwise burst errors. Therefore, according to one of its aspects, for correcting dynamical track errors the method comprises the steps of:

decoding a error-decodable word pair with a first pivot symbol, defining a next word pair with a second pivot symbol with a minimal shift with respect to the pivot symbol of the most recently decoded word pair, and undertaking second decoding of the next word pair, wherein said minimal shift is non-uniform as based on the most recent decoding, and upon completion of said second decoding recurrently cycling through said defining and undertaking operations. It can be proved that the non-uniform shifting strategy achieves an optimum protection against track-errors, regardless of the dynamics of such trackwise error bursts. A minimal shift of the pivot symbol means that either the word of the first code is shifted one word position, or the word of the second code is shifted one position, or both code words are shifted one position each. No larger shift is however allowed.

In contradistinction, the above referenced convolutional codes allow for an extremely straightforward encoding. However, decoding of trackwise burst errors is often inconclusive, inasmuch as the signalling of a burst termination cannot be done in a crisp and clear manner.

Advantageously, the first and second linear block codes are cyclic or semi-cyclic codes based on multibit symbols. This is the diamond format that has been found robust against various different fault models, and straightforward to decode. Various different strategies can be applied in view of the actual outcome of the word pair decoding.

The invention also relates to an apparatus for trackwise burst error correction in a multitrack storage format. Various additional advantageous aspects of the invention have been recited in dependent Claims.

BRIEF DESCRIPTION OF THE DRAWING

These and other aspects and advantages of the invention will be discussed more in detail hereinafter with reference to the disclosure of preferred embodiments, and more in particular with reference to the appended Figures that show in the invention.

DETAILED DESCRIPTION OF PREFERRED EMBODIMENTS

Figures 1, 2:
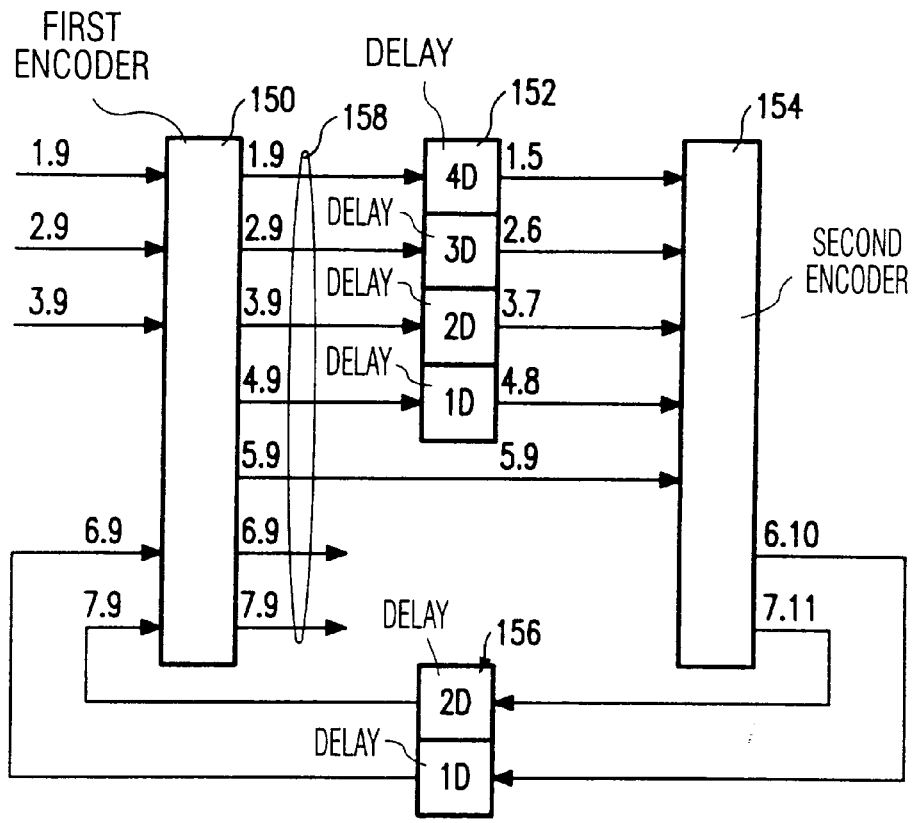
FIG. 1, a detailed diagram of an encoding embodiment.
FIG. 2, relative positions of various code symbols.

FIG. 1 gives a detailed diagram of an encoding embodiment, wherein the sizes of the various code words have been kept low for better instruction. In this respect, FIG. 2 gives relative positions of various code symbols. There are three streams of information symbols, starting with 1.1, 2.1, 3.1, respectively. There are two streams of first check symbols, starting with 4.1, 5.1, respectively. There are two streams of second check symbols, starting with 6.1, 7.1, respectively. The numbers of first and second check symbols need not to be identical. The symbols proper may have one or more bits, but eight bits is conventional. On the carrier, each row can be stored on an associated respective storage track. The first check symbols are generated on the basis of a single column as indicated by a first rectangle in FIG. 2. The second check symbols are generated on the basis of a diagonal string of symbols as indicated by a second rectangle in FIG. 2. If required, the second code words may have a greater depth of interleaving, for example in that a particular word of the second code has symbols in every second, third, etc. column. Various other formats would be open to the skilled art practitioner without diverging from the code format shown in FIG. 1.

In FIG. 1, the data symbols 1.9, 2.9, and 3.9 arrive from the left in a first arranging state at the input of the first encoder for producing the first check symbols 4.9 and 5.9. For simplicity, the delay caused by the encoding in block 150 has been ignored. Delay block 152 effects the realignment for producing the second arranging state. The respective delays differ by one column period, and decrease from four periods to nominally zero. At the input of second encoder 154 the indications are shown of the symbols arriving at that particular instant, thereby effecting the second arranging state. From the five symbols thus received the second encoder produces the two second check symbols 6.10 and 7.11. In delay block 156 the second check symbols are delayed so as to be in concord with the first arranging state at the input of the first encoder 150. The delays again differ by one column period, and the indications of the second check symbols arriving at the input of the first encoder 150 are 6.9 and 7.9 respectively, and belong to the same column as the data symbols arriving there. This means that the first encoder indeed produces the correct column that may be transferred to the storage medium or carrier as indicated by the arrow 158. The positions of the two encoder blocks may be interchanged, causing the unencoded data to first arrive at the input of the second encoder 154. However, this often would cost more delay. The matrix multiplications necessary for encoding can be effected by means of suitably programmed standard hardware, or by special purpose hardware. If the two codes have sufficient likeness, parts of the encoders could be used in common.

Figure 3:
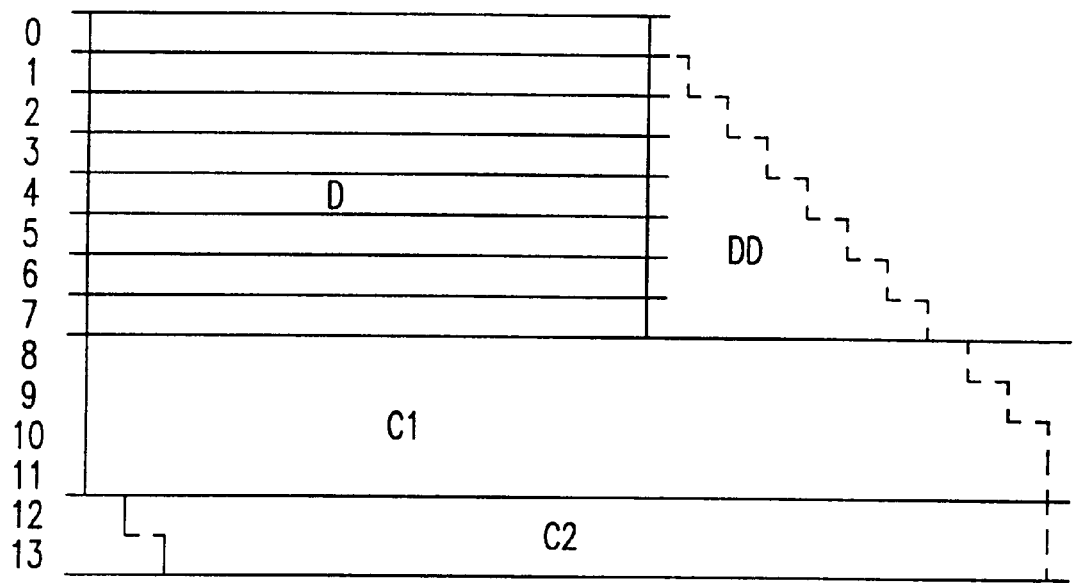
FIG. 3, symbol locations in an error correctable block.

FIG. 3 shows symbol locations in an error correctable block. For this embodiment, as well as for the ones discussed hereinafter, there are eight data tracks labelled 0–7, four tracks with first error check words labelled 8–11, and two tracks with second error check words labelled 12–13. In the format, first code words run vertically in the Figure, whereas second code words run diagonally from top left to bottom right at 45°. In principle, both types of code words can run at slanting angles with respect to the tape axis. The block indicated D on the level of the actual code contains user data symbols, for example of eight bits each. At the right hand side, the triangle indicated DD contains dummy data symbols with value 0. The blocks indicated C1 and C2 contain respectively first and second check symbols. As has been discussed in the references, when using (semi)-cyclic codes, outside the finite shape of symbols in FIG. 3 there is no further influence of the contents of the user symbols D. Therefore, this is a finite impulse response code. The code words themselves are elements of a block code, generally a shortened Reed-Solomon code. In practice other linear codes would be usable as well, although this may imply surrendering the finite impulse response property. The references discuss various amendments to the format shown that are however ignored for the present invention.

DECODING TRACK ERRORS

Figure 4:
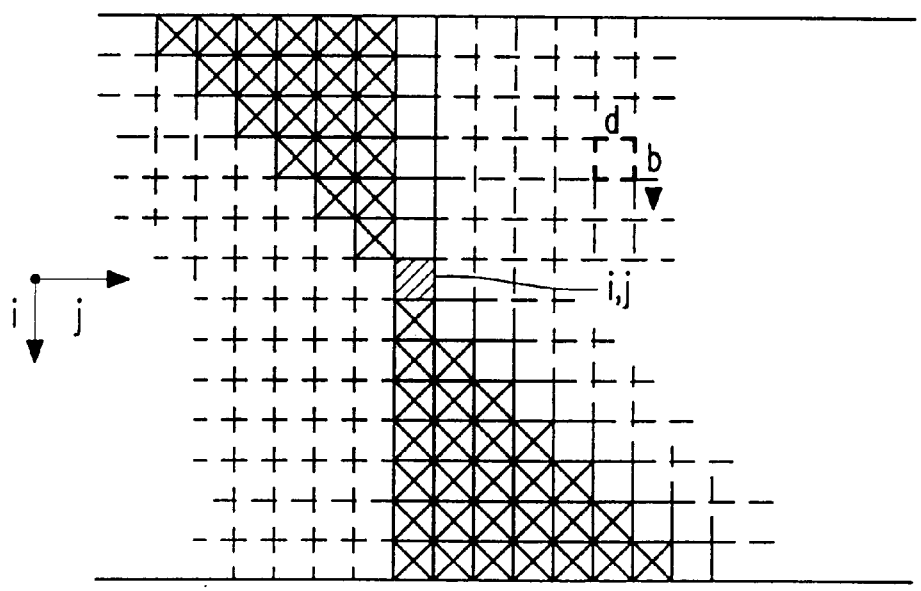
FIG. 4, an illustration of an error correcting process.

FIG. 4 illustrates an error correcting process, in particular with respect to decoding track errors. In this context, first the mathematical background of the decoding is highlighted. Suppose that the first code has a symbol distance d1, and the second code has a symbol distance d2. In FIG. 3, these have values 5 an 3, respectively. For a separate code word, a distance d allows to remediate $2t+e \leq d-1$ symbols, wherein t is the number of error symbols, and e is the number of erasure symbols. Now first, for the code C, amalgamated from the two codes, it can be proven that the minimum distance is distance expressed in a number of tracks is at least equal to d1+d2−1, and the method hereinafter proves that, given sufficient elementary distances, it is indeed possible to remediate an appropriate plurality of tracks, independent of the burst length, and independent of the variations of the number of bursts. FIG. 4 first shows the pivot symbol as a hatched block that as shown, forms part of one code word from either of the two codes.

First a set T(i,j) of recent symbols is defined, that are correct as well as unerased, according to:

$$T(i,j)=\{(u,v)|1 \leq v<j, u-v \leq (i-j)\} U \{(u,v)|j \leq v \leq n, u-v>(i-j)\}$$

In FIG. 4, these are the symbols indicated by a cross that lie in two triangles, roughly between the two words sharing the actual pivot symbol, but excluding the upper symbols of the actual vertical word and the lower symbols of the actual diagonal word. Now, the C1 word through the pivot symbol is decoded, whilst marking the pivot symbol therein as an erasure symbol; suppose that it has N1 error symbols and R1 erasure symbols, not counting the pivot symbol itself. Note that the pivot symbol could have been an erasure symbol already by itself, for example through a failed demodulation of a channel symbol.

Furthermore, the C2 word through the pivot symbol is decoded, whilst not marking the pivot symbol as an erasure symbol; in fact, first the correcting of the erased pivot symbol is done, which is thereupon checked by decoding the other word of the word pair in question. Suppose that the C2 word contains N2 error symbols and R2 erasure symbols, and also:

$$2(N1+N2)+R1+R2 \leq d1+d2-2. \tag{1}$$

Now, the C1 word through the pivot symbol is decoded, whilst marking the pivot symbol as an erasure symbol. This may or may not have been the case before undertaking the decoding.

Now, a reliability quantity Δ is defined for a word decoding, as follows: $\Delta 1:=0$, if decoding of a C1 word failed, in that the earlier inequality for the number of errors and erasures did not hold. Otherwise, $\Delta 1:=d1-2\omega 1-R1-1$. Herein ω is the number of error corrections proposed by the decoder, whilst not counting erasures mended. Similarly, for the C2 word that has no pivot symbol erased in the decoding (it could have the pivot symbol erased through some other mechanism, such as a demodulation error): $\Delta 2:=d2-2\omega 2-R2$. The procedures with respect to the two words of the pair could be interchanged.

Now, the decoding of at least one of the words through the pivot symbol will give a correct result. Otherwise, $2N1+R1+1 \geq d1$, as well as $2N2+R2 \geq d2$ would hold, which would be inconsistent with (1).

We will prove that if diagonal decoding was incorrect, $\Delta 2 \leq \Delta 1-1$. However, the transmitted diagonal and the received versions can differ in at most $N2+\omega 2$ symbols. In fact, they differed in at least d2−R2 symbols, thus: $N2+\omega 2 \geq d2-R2$. Therefore, $\Delta 2=d2-2\omega 2-R2 \leq 2N2-d2+R2$. However, vertical decoding is correct, causing $N1=\omega 1$, and thus $\Delta 1=d1-2N1-R1-1$. From (1) it follows that $$\Delta 2-\Delta 1 \leq 2(N1+N2)+R1+r2+1-(d1+d2) \leq -1.$$

The reverse applies when vertical decoding was incorrect. Based on the previous propositions, the following decoding procedure is constructed.

First decode the C1 word through the pivot symbol with the pivot symbol itself signalled as an erasure, and also decode the C2 word through the pivot symbol. The quantities $\Delta 1$ and $\Delta 2$ are defined as earlier.

Accept the decoding proposal with the largest value of $\Delta$; in case of equality, both proposals are accepted.

If both decoding proposals are accepted, the new pivot symbol is (i,j+1); this means that the pivot symbol is shifted minimally in such a way that two new words are taken for decoding next;

if only the vertical decoding proposal is accepted, the new pivot symbol is (min(n,i+1),j+1); this means that the pivot symbol is shifted minimally in such a way that only a new C1 word is taken for decoding next, whilst retaining the old C2 word; this policy may not cause crossing the barrier of the lower tape edge however;

if only the diagonal decoding proposal is accepted, the new pivot symbol is (max(1,i−1),j); this means that the pivot symbol is shifted minimally in such a way that only a new C2 word is taken for decoding next, whilst retaining the old C1 word; this policy may not cross the barrier of the upper tape edge however.

Now, if Equation (1) is satisfied and the set T(i,j) of recent symbols contains no errors or erasures, then it may be proved that the above procedure produces at least one decoding proposal, any accepted decoding proposal is correct and furthermore, the set of recent symbols in T(i',j') associated to the next pivot symbol (i',j') contains neither error nor erasure.

The above decoding procedure gives a correct result if (1) is satisfied and all positions in the set T(i,j) contain correct symbols. The demand on T(i,j) is automatically satisfied with pivot symbol (i,j)=(n,0). So, if we start decoding around pivot symbol (n,0) and the sum of twice the number of tracks in error and the number of erased tracks is less than (d1+d2−1), then the correct decoding result is obtained. That is, the decoding procedure realizes the track error correcting capabilities guaranteed by the bound $d_T \geq d1+d2-1$, wherein $d_T$ is the minimum distance expressed in a number of tracks.

If the pivot symbol is close to the upper row, only few errors can reside in the column, and therefore, vertical decoding is surely correct. In fact, no position (1,j), (2,j), ... (i−1,j) can contain both an error and also an erasure, so $N1+R1 \leq i-1$. Consequently, if $2i \leq d1+R1+1$, then $$2N1+(R1+1)=2(N1+R1)-R1+1 \leq 2(i-1)-R1+1 \leq d1,$$

so incorrect decoding is impossible. That is, if $2i \leq d1+R1+1$, then the vertical decoding proposal can be accepted irrespective of its reliability $\Delta 1$. Similarly, the diagonal decoding can be accepted whenever $2(n-i+1) \leq d2+R2$. With this modification, the decoding procedure will more often accept two decoding proposals, and in consequence, operate faster.

If decoding is started around a pivot symbol (i,j), with set T(i,j) not being completely free of errors and erasures, then the decoding procedure does not necessarily yield the correct result, even if (6) is satisfied. For example, take for C1 and C2 the binary (3,2,2) code, and assume the received strip R has only 'ones' in its top row, and 'zeroes' elsewhere. As $D_T(C)=3$, and R has track weight 1, R should be decoded to the all-zero strip. Now we assume that we start decoding around pivot symbol (3,2). The diagonal decoder has detected an error. With vertical decoding, the pivot symbol is erased and subsequently decoded to a '1'. The new pivot symbol is (3,3), and we are in the same situation: position (3,3) will be decoded to a '1', the new pivot symbol is (3,4), and so on.

The procedure can be modified by erasing a row as soon as an accepted output makes changes it. In this way, erroneous rows are gradually erased. If we start this modified procedure in pivot symbol (n,0), it correctly decodes all error patterns with N erroneous rows and R erased rows satisfying $$2N+R \leq d1+d2-2.$$

The original procedure however, is also capable to cope with error patterns for which the set of erroneous tracks differs columnwise, provided that the local condition (1) is satisfied everywhere.

Figure 5:
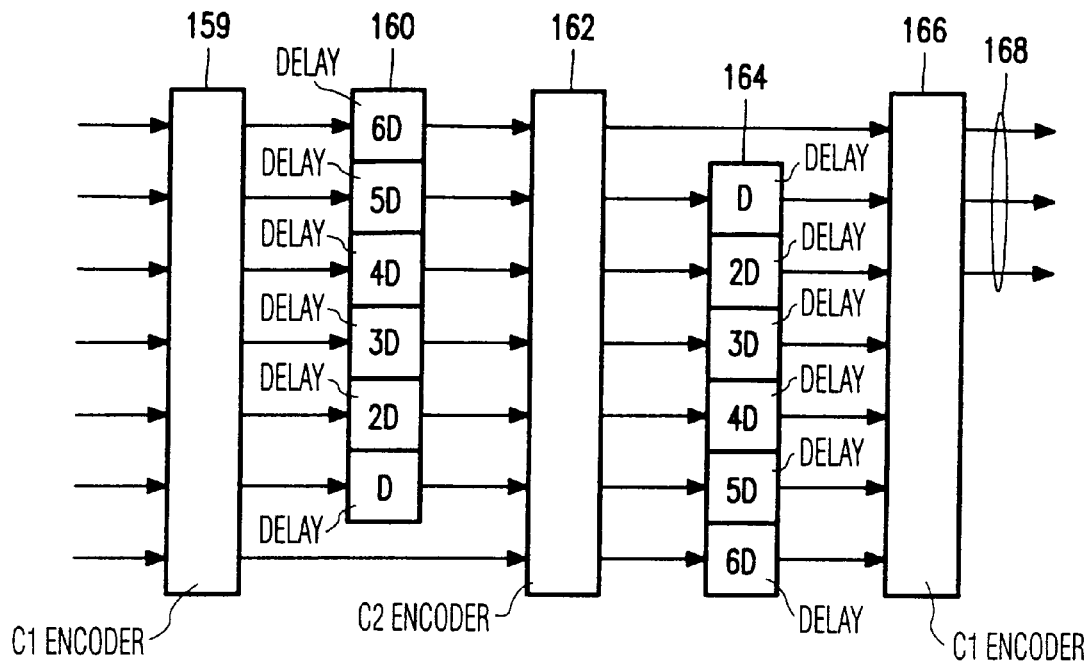
FIG. 5, an exemplary decoder arrangement.

FIG. 5 is a block diagram of a known decoder arrangement, that conforms to the set-up according to FIG. 1, for the decoding of random errors. At left, the symbols of a complete first code word arrive from a device input, so that they in principle can be decoded. Block 159 is a decoder for the first code words. Decoding is supposed to be is instantaneous, so that symbol numbering is not influenced by the decoding. Next, the symbols are delayed with monotonically decreasing delays (D) in block 160, causing the respective symbols of a second code word to be realigned at the input of second decoder 162. The decoding is again supposed to be instantaneous. If the decoding result is satisfactory, the output of second decoder 162 may be forwarded to a user directly via second delay stage 164, that has inverse delay values as compared with delay stage 160. If not, the output of second decoder 162 is forwarded to the user via second delay stage 164 and third decoder stage 166. In this latter option, the first code word is presented to a third decoder stage that may share hardware with block 159. If the C1 and C2 codes are sufficiently alike, also block 162 may join in the sharing. At output 168 the user symbols are presented. If necessary, the second code words may be reconstituted again by repeating the blocks 160, 162.

Figure 6:
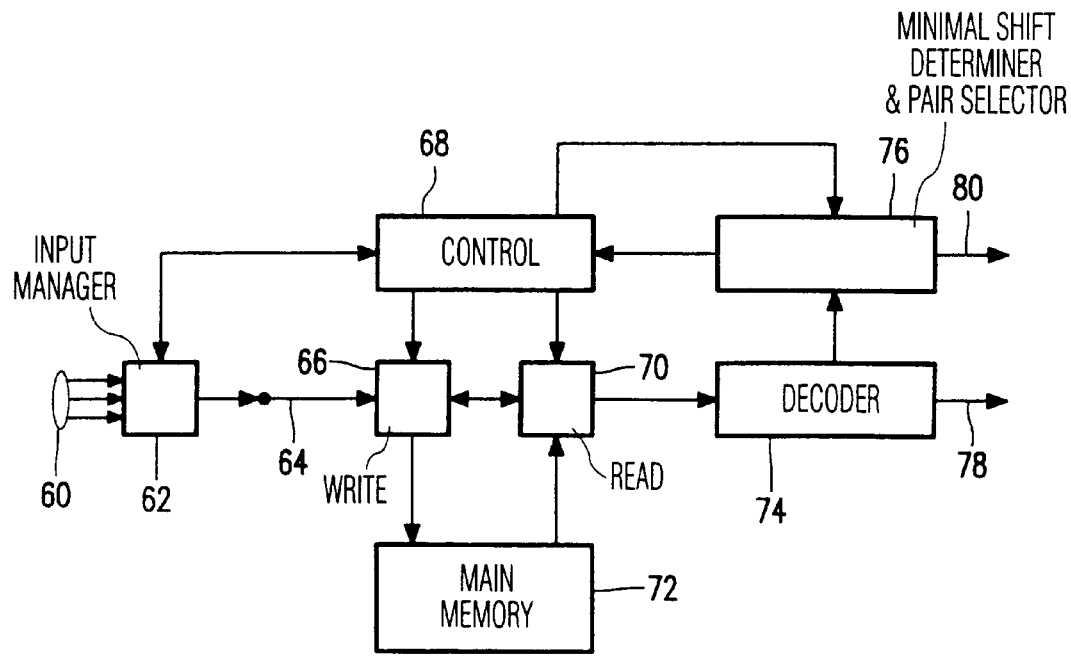
FIG. 6, a different hardware mapping of a decoder according to the invention.

FIG. 6 shows a different hardware mapping of a decoder, in particular for decoding of trackwise burst errors according to the invention. Input 60 symbolizes the trackwise parallel reception of the various symbol streams. Input element 62 manages these streams so that they synchronize to the internal operation of the decoder. For example, tape drive speed is kept constant through a feedback mechanism, and the parallel streams may be converted to a single stream of symbols. Overall control resides in block 68 that executes a dialog with various other subsystems. Block 66 controls the writing of the input streams into main memory 72, as governed by overall control block 68. Block 70 controls the reading of the input streams from main memory 72, as governed by overall control block 68. Blocks 66, 70 through a dialog avoid memory access conflicts. Block 74 is the decoder proper that receives the word pairs that are read from main memory 72, and executes the decoding proper. The reliability of the two decodings is checked, the corrections to the symbols are retained as long as necessary, and any correct information suitable for further use is outputted on output 78. In block 76 the minimal shift of the pivot symbol is determined, and the associated new memory addresses in main memory 72 are assessed for reading the new pair of words. This information is forwarded to overall control 68 that therefrom generates physical addresses in main memory. Synchronizing control to the column of blocks 76, 74 form overall control is communicated as shown by an arrow. User data on output 78 is accompanied by an error evaluation signalization on line 80.

Figure 7:
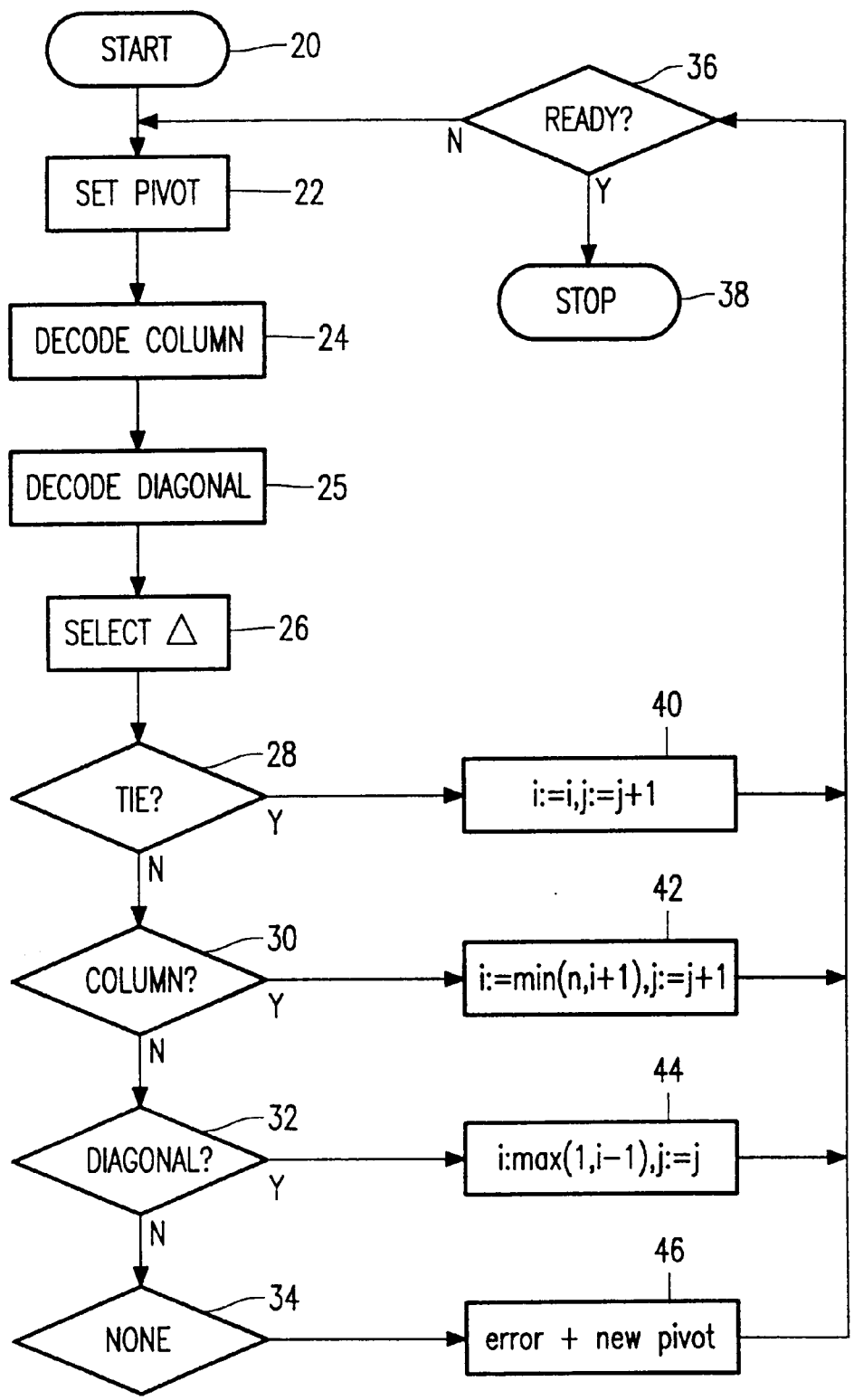
FIG. 7, a flow chart of the decoding process according to the invention.

FIG. 7 is a flow chart of the decoding process according to the invention. In block 20, the system is set up, necessary storage space is allocated, and access to the symbols to be decoded is organized. In block 22 the pivot symbol is set up, for example as being the bottom symbol of the first column. In block 24 the C1 word containing the pivot symbol is decoded, wherein the pivot symbol is marked as an erasure symbol. In block 25 the C2 word containing the pivot symbol is decoded. In block 26, the two quantities Δ1, Δ2 are confronted. In block 28, occurrence of a tie between the two Δ quantities is detected. Then in block 40, the pivot symbol is minimally shifted over one column, thereby presenting both a new column word and a new diagonal word. In block 30, a best result regarding the column is detected. Then in block 42, the pivot symbol is minimally shifted over one column, while retaining the old diagonal C2 word. In block 32, a best result regarding the diagonal is detected. Then in block 44, the pivot symbol is minimally shifted over one diagonal position to the upper right, while retaining the old column C1 word. In block 46 it is detected whether both decoded words yield an unacceptable result. Then in block 46, an error flag is set and a new pivot symbol is selected. Inasmuch as the error cannot be remedied, a straightforward course would be to select both the next C1 word, and also the next C2 word, so that the pivot symbol shifts minimally in a horizontal direction. In block 36, it is detected whether the decoding is ready. If not, the system goes to block 22 for setting the pivot and the associated column word and diagonal word. Alternatively, in block 58, the system is relinquished.

Figure 8:
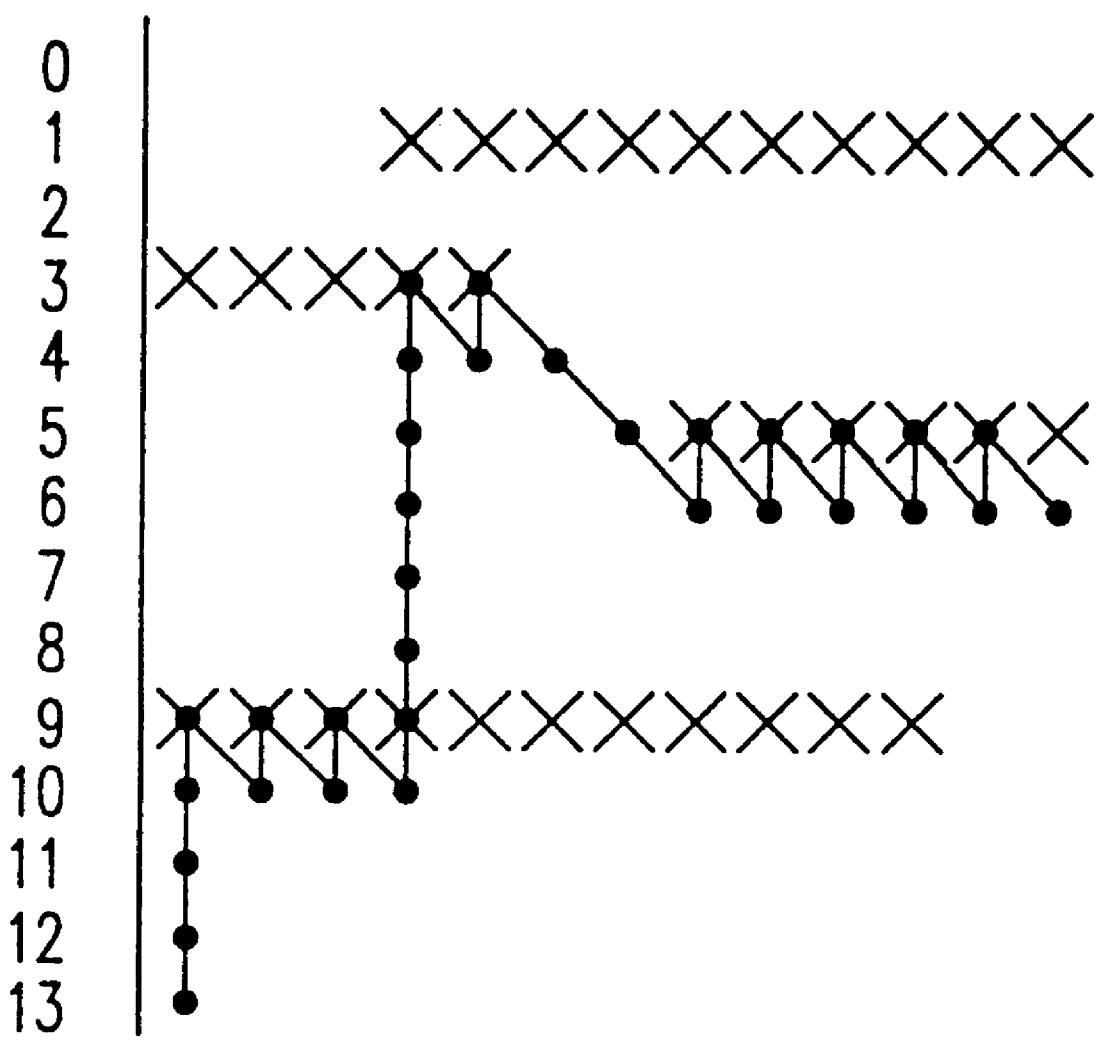
FIG. 8, an exemplary multitrack burst error occurrence.

FIG. 8 illustrates an exemplary multitrack burst error occurrence, that is correctable according to the error protection format shown in FIG. 3. Error symbol bursts have been indicated as rows of crossed blocks. First, the pivot symbol arbitrarily starts in the lower left hand corner. The distances are d1=5, d2=3, so that the liability quantities are Δ1=4−ω; Δ=3−2ω2. The movement of the pivot symbol is vertical if:

$$\Delta 1 \geq \Delta 2; \omega 1 \leq \omega 2$$

The movement is diagonal if $$\Delta 1 < \Delta 2; \omega 1 > \omega 2$$

The pivot symbol positions have been indicated as a string of dots. It should be clear that the decoding procedure can be varied within the concept of the present invention, taking into account actual error patterns.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

We claim:

1. A method for trackwise burst error correction in multitrack storage based on an error protective code format that comprises first and second linear block codes each based on a plurality of symbols, and wherein each individual symbol forms a pivot symbol of a word pair that consists of one word from either code that have the pivot symbol in common and have mutually different cross-track orientations, comprising the steps of:

decoding an error-decodable word pair with a first pivot symbol;

defining a next word pair with a second pivot symbol with a minimal shift with respect to the pivot symbol of the most recently decoded word pair;

undertaking decoding of the next word pair, wherein said minimal shift is non-uniform as based on the most recent decoding; and upon completion of said second decoding, recurrently cycling through said defining and undertaking steps.

2. The method as claimed in claim 1 wherein the symbols are multibit symbols.

3. The method as claimed in claim 2, wherein said first and second linear block codes are cyclic or semi-cyclic codes.

4. The method as claimed in claim 1, wherein the decoding step assigns to each separate word decoded a reliability value, and the defining step retains in the next word pair from the already decoded word pair the word that has been decoded at a lower prespecified reliability, whilst accepting the word that has been decoded at a relatively higher reliability as ultimately decoded.

5. The method as claimed in claim 4, wherein any word of a word pair is accepted as ultimately decoded where the word in question attains at least a threshold decoding reliability level.

6. The method as claimed in claim 1, wherein:

the decoding step of said word pair assigns to each word of the pair a reliability value; and the defining step when the already decoded word pair both words had been decoded at equal reliability, accepts both the latter words as being ultimately decoded.

7. The method as claimed in claim 1, wherein the decoding of a word pair starts with signalling in exactly one of the two words the actual pivot symbol as an erase symbol.

8. The method as claimed in claim 1, wherein in case of a subliminal reliability of both words of a word pair, both the latter words are marked by an error marker.

9. An apparatus for trackwise burst error correction in multitrack storage based on an error protective code format that comprises first and second linear block codes each based on a plurality of symbols, and wherein of each word pair that consists of one word from either code, which words have a pivot symbol in common and have mutually different cross-track orientations, so that each individual symbol forms the pivot symbol of one such word pair, comprising:

decoding means for decoding an error-decodable word pair with a first pivot symbol; and selection means for defining a next word pair with a second pivot symbol at a minimal shift with respect to the pivot symbol of the most recently decoded word pair, and for then generating an activation signal for the decoding means to undertake decoding of the next word pair, wherein said minimal shift is non-uniform as based on the most recent decoding;

and wherein said decoding means have an output for subsequent to said decoding generating an activation signal for the selection means.

* * * * *